(12) United States Patent
Smith et al.

(10) Patent No.: US 10,483,154 B1
(45) Date of Patent: Nov. 19, 2019

(54) FRONT-END-OF-LINE DEVICE STRUCTURE AND METHOD OF FORMING SUCH A FRONT-END-OF-LINE DEVICE STRUCTURE

(71) Applicant: GLOBALFOUNDRIES Inc., Grand Cayman (KY)

(72) Inventors: Elliot John Smith, Dresden (DE); Marcus Wolf, Dresden (DE); Carsten Peters, Dresden (DE); Markus Lenski, Dresden (DE); Loic Gaben, Grenoble (FR)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/015,351

(22) Filed: Jun. 22, 2018

(51) Int. Cl.
*H01L 21/762* (2006.01)
*H01L 21/02* (2006.01)
*H01L 29/06* (2006.01)

(52) U.S. Cl.
CPC .. *H01L 21/76283* (2013.01); *H01L 21/02164* (2013.01); *H01L 21/02274* (2013.01); *H01L 29/0649* (2013.01)

(58) Field of Classification Search
CPC ......... H01L 21/76283; H01L 21/02274; H01L 21/02164; H01L 29/0649
USPC ....................................................... 257/506
See application file for complete search history.

(56) References Cited

U.S. PATENT DOCUMENTS

| | | | |
|---|---|---|---|
| 8,962,430 B2 | 2/2015 | Liu et al. | |
| 2004/0212035 A1* | 10/2004 | Yeo | H01L 21/76229 257/510 |
| 2005/0079682 A1* | 4/2005 | Lee | H01L 21/76232 438/400 |
| 2006/0131688 A1* | 6/2006 | Klootwijk | H01L 21/76264 257/506 |
| 2007/0205489 A1* | 9/2007 | Tilke | H01L 21/76229 257/618 |

OTHER PUBLICATIONS

Mertens et al., "Vertically Stacked Gate-All-Around Si Nanowire Transistors: Key Process Optimizations and Ring Oscillator Demonstration," IEDM17-828-831, 2017.

* cited by examiner

*Primary Examiner* — Caleen O Sullivan
(74) *Attorney, Agent, or Firm* — Amerson Law Firm, PLLC

(57) ABSTRACT

In various aspects, the present disclosure relates to device structures and a method of forming such a device structure. In some illustrative embodiments herein, a device is provided, including a semiconductor substrate having a first trench formed therein, and a first trench isolation structure formed in the first trench. The first trench isolation structure includes first and second insulating liners formed adjacent inner surfaces of the first trench, wherein the first insulating liner is in direct contact with inner surfaces of the first trench and the second insulating liner is formed directly on the first insulating liner, and a first insulating filling material which at least partially fills the first trench. In some aspects, a thickness of the first insulating liner is greater than a thickness of the second insulating liner.

19 Claims, 2 Drawing Sheets

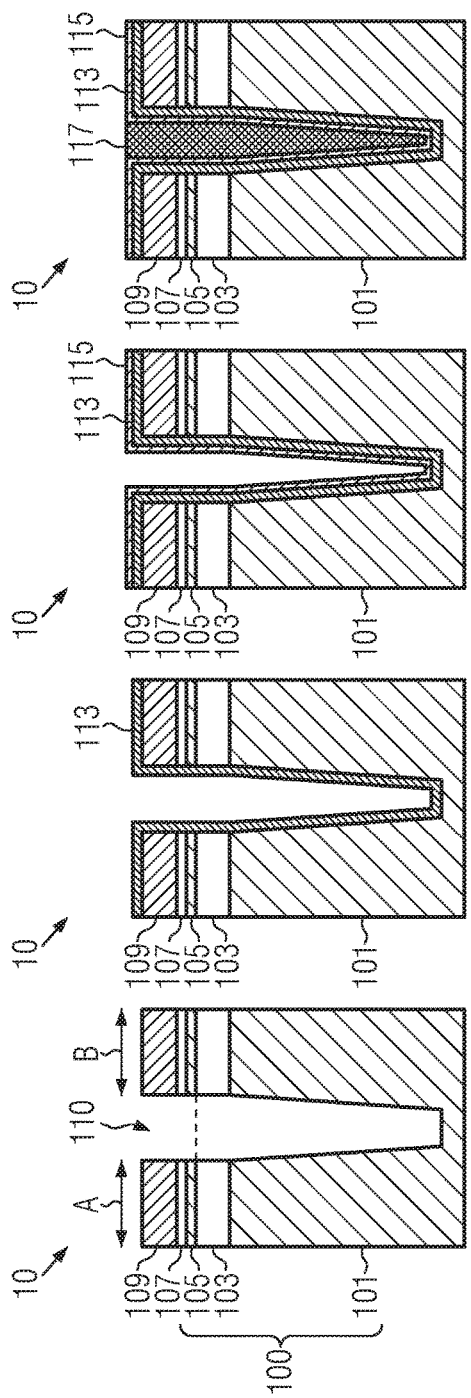

FRONT-END-OF-LINE DEVICE STRUCTURE AND METHOD OF FORMING SUCH A FRONT-END-OF-LINE DEVICE STRUCTURE

BACKGROUND

1 Field of the Disclosure

The present disclosure relates to semiconductor device structures fabricated during front-end-of-line (FEOL) processes and, more particularly, to a FEOL device structure and methods of forming such a device structure.

2. Description of the Related Art

Generally, the front-end-of-line (FEOL) represents the first portion of the fabrication of integrated circuits (ICs), where individual devices, such as transistors, capacitors, resistors and the like, are patterned in and on a semiconductor substrate. In general, FEOL covers all process steps beginning with the preparation of a semiconductor substrate prior to the formation of the individual devices, e.g., by defining active regions in upper surface portions of the semiconductor substrate, such as by the formation of trench isolation structures, up to (but not including) the deposition of metal interconnect layers on the fabricated individual devices. For example, known FEOL processing contains the processes of selecting the type of wafer to be used, applying a chemical mechanical planarization (CMP) and cleaning of the wafer, forming trench isolation structures, e.g., shallow trench isolations (STIs), performing implants for well formation, applying gate module formation and applying source and drain module formation.

In some applications, trench isolation structures include deep trench isolation (DTI) structures. When comparing trenches of DTI structures with trenches of STI structures, the trenches of DTI structures have a greater depth reaching into the semiconductor substrate than the trenches of STI structures. At advanced technology nodes, the aspect ratio of trenches (i.e., a ratio of depth to width of a trench) become higher and it is increasingly challenging to perform high aspect ratio processes (HARP) for reliably filling deep trenches, e.g., without leading to void formation in the trenches.

In known processes at advanced technology nodes, e.g., in the 12 nm fully depleted silicon-on-isolator (FDSOI) semiconductor technology, flowable chemical vapor deposition (FCVD) is employed in HARP in order to fill isolation trenches, particularly deep isolation trenches of DTI structures. In standard FCVD oxide processes, a deposition of an $SiO_2$ film is employed by supplying trisilylamine (TSA) and $NH_X$ at a process temperature of 40-60° C., followed by an $O_3$ curing at a temperature of 100-200° C. The accordingly formed oxide is further treated by a subsequent densification annealing performed as a steam annealing at 400-700° C. for improving the oxide quality, particularly to increase the density of the oxide. However, the steam annealing is prone to destroying semiconductor structures already formed in the semiconductor substrate, e.g., SiGe channels, if these channels are not hermetically sealed during the steam annealing. Accordingly, known approaches further include a step of depositing an SiN liner prior to an FCVD process. After the steam annealing is completed, this SiN liner is pulled back to or below a buried oxide layer (BOX) of an FDSOI substrate, after which the recess is refilled with another oxide, usually a high density plasma (HDP) oxide.

The above described state of the art leads to the issue that, when pulling back the SiN liner, the BOX material becomes etched, thereby resulting in an undercut of the SOI. Upon refilling the trench, the undercut causes voids under the SOI (if pure HDP oxide is used) or large voids near the surface (if an oxide liner is deposited before filling with HDP oxide).

In any event, the resulting voids may then be reopened during subsequent FEOL processing and the voids are then possibly filled with other materials, thereby raising the risk of causing electrical shorts, reliability fails or additional stress components.

In view of this situation, it is desirable to provide a device structure and a method of forming such a device structure which at least partially overcomes some of the above discussed issues.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In an aspect of the disclosure, a device is provided, including a semiconductor substrate having a first trench formed therein, and a first trench isolation structure formed in the first trench. Herein, the first trench isolation structure includes first and second insulating liners formed adjacent inner surfaces of the first trench, wherein the first insulating liner is in direct contact with inner surfaces of the first trench and the second insulating liner is formed directly on the first insulating liner, and a first insulating filling material which at least partially fills the first trench. Furthermore, a thickness of the first insulating liner is greater than a thickness of the second insulating liner.

In another aspect of the disclosure, a device is provided, including a semiconductor substrate having a semiconductor-on-insulator (SOI) configuration, including a semiconductor layer, a semiconductor base substrate and a buried insulating material layer interposed between the semiconductor layer and the semiconductor base substrate, and the semiconductor substrate having a trench formed therein, the trench at least partially extending into the semiconductor base substrate, and a trench isolation structure formed in the trench. Herein, the trench isolation structure includes first and second insulating liners formed adjacent inner surfaces of the trench, wherein the first insulating liner is in direct contact with the inner surfaces of the trench and the second insulating liner is formed directly on the first insulating liner, and first and second insulating filling materials filling the trench, wherein the second insulating filling material is formed on the first and second insulating liners and the first insulating filling material in the trench.

In still another aspect of the present disclosure, a method is disclosed including etching a first trench into a semiconductor substrate, consecutively forming first and second insulating liners in the first trench, and forming a first insulating filling material on the first and second insulating liners in the first trench. Herein, a thickness of the first insulating liner is greater than a thickness of the second insulating liner.

BRIEF DESCRIPTION OF THE DRAWINGS

The disclosure may be understood by reference to the following description taken in conjunction with the accompanying drawings, in which like reference numerals identify like elements, and in which:

FIGS. 1a-1g schematically show in cross-sectional views a process of fabricating a FEOL device structure in accordance with some illustrative embodiments of the present disclosure.

Figure 2A:
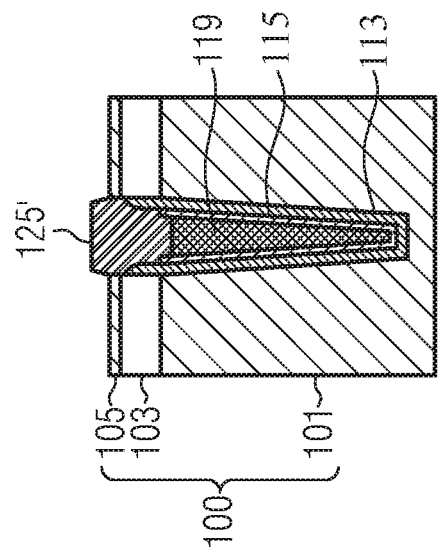
FIGS. 2a and 2b schematically show in cross-sectional views different stages during fabricating of a FEOL device structure in accordance with other illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure relates to front-end-of-line (FEOL) device structures and to a method of forming a FEOL device structure. More particularly, the present disclosure relates to the fabrication of trench isolation structures during FEOL processing at advanced technology nodes, where issues of current high aspect ratio processes (HARP) are at least partially overcome. In accordance with some illustrative embodiments of the present disclosure, the fabrication of trench isolation structures is described wherein a trench is formed in an upper surface portion of a semiconductor substrate and inner surfaces of the trench are lined with a dual liner structure prior to filling the trench with an oxide material. Herein, the dual liner structure includes a first insulating liner and a second insulating liner, wherein the thickness of the first insulating liner is greater than the thickness of the second insulating liner.

In some illustrative embodiments of the present disclosure, a trench isolation structure is provided during FEOL processing, the trench isolation structure having a dual liner structure formed prior to a filling of the trench with an oxide material, wherein the filling of the trench with an oxide material includes a first filling step with a flowable oxide material and a second filling step with a high density plasma (HDP) oxide.

In accordance with illustrative embodiments of the present disclosure, a flowable chemical vapor deposition (FCVD) process may be employed for depositing a flowable film using siloxane precursors, which may be used with co-reactants in the form of radicals generated from plasmas. The accordingly formed films may have the advantageous effect of a low wet etch rate ratio (WERR) and low shrinkage rates. For example, a WERR may be defined as a ratio between the etch rates of two material films, wherein an etch rate is in turn defined as a thickness change determined after an etching process divided by the etch time. For example, siloxane precursors may be vaporized to a CVD chamber and co-reactants, e.g., $NH_3$ only or $NH_3$—$O_2$ with or without Ar, may be delivered to the chamber through a remote plasma source, which will generate plasma active species as the co-reactants. The plasma activated co-reactant molecules (radicals) may have high energies and react with Si-containing precursor molecules in the gas phase to form flowable SiON polymers. These polymers accordingly deposit on the wafer and, due to their flowability, the polymers flow through trenches and make a gap fill. Subsequently, these deposited films are subjected to curing, such as a curing by $O_3$ and/or UV, and an annealing step is performed, e.g., steam annealing or annealing with $NH_3$. As a result, depending on the precursors used, a film comprising silicone oxide or silicon nitride may be deposited.

The FEOL device structure of the present disclosure can be manufactured in a number of ways using a number of different tools. In general, though, the methodologies and tools are used to form structures with dimensions in the micrometer and nanometer scale. The methodologies, i.e., technologies, employed to manufacture the FEOL device structure of the present disclosure have been adopted from integrated circuit (IC) technology. For example, the structures are built on wafers and are realized in films of material patterned by photolithographic processes on the top of a wafer. In particular, the fabrication of the FEOL device structure uses three basic building blocks: (i) deposition of thin films of material on a substrate; (ii) applying a patterned mask on top of the film by photolithographic imaging; and (iii) etching the film selectively to the mask.

FIG. 1a schematically illustrates, in a cross-sectional view, an upper portion of a semiconductor substrate 100 at an early stage during FEOL processing in accordance with some illustrative embodiments of the present disclosure. In accordance with some illustrative examples herein, the semiconductor substrate 100 may have a bulk configuration comprising a semiconductor material, such as silicon, silicon germanium and the like. Alternatively, and as illustrated in the drawings of the present disclosure, the semiconductor substrate 100 may have a semiconductor-on-insulator (SOI) configuration, comprising a semiconductor base substrate 101, a buried insulating material layer 103, and a semiconductor layer 105. For example, when the semiconductor substrate 100 is in the SOI configuration, as it is illustrated in the drawings of the disclosure, a semiconductor/insulator/base substrate configuration may be implemented, such as a silicon/silicon oxide/silicon substrate configuration. In accordance with some special illustrative examples herein, the semiconductor layer 105 may comprise a semiconductor layer, e.g., a silicon layer, the buried insulating material 103 may comprise an insulating material, e.g., a buried oxide material (BOX material), and the semiconductor base substrate 101 may comprise a semiconductor substrate, such as a silicon substrate or some other base substrate as it is known in the art.

In accordance with some special illustrative examples, the SOI configuration may be realized as a partially depleted SOI (PDSOI) configuration, or a fully depleted SOI (FDSOI) configuration. The person skilled in the art will appreciate that, when employing FDSOI techniques, the buried insulating layer 103 may have a thickness of at most 30 nm, e.g., in the range of about 10-30 nm, or of at most 10 nm, e.g., in the range of about 2-10 nm in ultrathin FDSOI techniques.

In accordance with some illustrative embodiments of the present disclosure, the semiconductor layer 105 may be provided by P-type monocrystalline silicon having a plane orientation of (100), (110) or (100) parallel to an orientation flat or notch. This does not pose any limitation on the present disclosure and another type of silicon may be used. In accordance with some special illustrative examples herein, the semiconductor layer 105 may have a thickness of about 30 nm or less, e.g., in the range of about 10-20 nm, in the case of FDSOI applications. In PDSOI applications, the semiconductor layer 105 may have a thickness of more than 30 nm.

Prior to the stage illustrated in FIG. 1*a*, the semiconductor substrate 100 may be prepared and subjected to a patterning process, in which a masking pattern 109 may be formed over a passivation layer 107, e.g., a thin oxide layer, which is formed on an upper surface of the semiconductor layer 105. For example, the masking pattern 109 may be a photoresist or hard mask that may be lithographically patterned in accordance with known patterning techniques (exposing to an energy (e.g., light) for forming patterns (openings) in the resist), wherein a trench 110 is formed in the semiconductor substrate 100 when performing an etching process (not illustrated) through the masking pattern 109 and etching the trench 110 into the passivation layer and the semiconductor substrate 100. The trench 110 may be a deep trench of a deep trench isolation (DTI) structure extending through the semiconductor layer 105, the buried insulating material layer 103 and partially into the semiconductor base substrate 101. In addition, a trench of a shallow trench isolation (STI) structure may be formed by etching a trench into the semiconductor substrate 100 extending into the semiconductor substrate 100 as indicated by a broken line in FIG. 1*a*. For example, the STI trenches (a depth is indicated in FIG. 1*a* by a broken line) may extend through the semiconductor layer 105 to expose the buried insulating material 103, e.g., by ending on an upper surface of the buried insulating material 103 or partially extending into the buried insulating material 103.

As illustrated in FIG. 1*a*, the trench 110 separates the semiconductor layer 105 into a first active region A and a second active region B. In each of the active regions A and B, one or more semiconductor devices (not illustrated), such as transistors or the like, may be formed in accordance with known FEOL processing after trench isolation structures are completed.

Referring to FIG. 1*b*, the FEOL device structure 10 is schematically illustrated at a more advanced stage during fabrication, after a deposition process is performed and a first insulating liner 113 is deposited over the FEOL device structure 10 so as to cover inner sidewalls of the trench 110 and upper surfaces of the masking pattern 109. In accordance with some illustrative examples herein, the first insulating liner 113 may be formed by silicon oxide, e.g., $SiO_2$. For example, the first insulating liner 113 may be deposited by a conformal film deposition (CFD) process, such as an atomic layer deposition (ALD) process. As a special but not limiting example herein, a silicon oxide material may be conformally deposited by the CFD process over the FEOL device structure 10 shown in FIG. 1*a*. For example, the deposited first insulating liner 113 may have a thickness in a range from about 2-15 nm.

Referring to FIG. 1*c*, the FEOL device structure 10 is schematically illustrated in a cross-sectional view at a more advanced stage during fabrication, after a second insulating liner 115 is formed on the first insulating liner 113. In accordance with some illustrative examples herein, the second insulating liner 115 may be formed by depositing a silicon nitride material over the FEOL device structure 10.

In accordance with some special illustrative examples herein, the thickness of the first insulating liner may be at least one times greater than the thickness of the second insulating liner. For example, the thickness of the first insulating liner may be 2 times, 2.5 times, 3 times or generally X times greater than the thickness of the second insulating liner, wherein X is a real number greater than 1.5. In accordance with some illustrative examples herein, the thickness of the second insulating liner 115 may be in a range from about 2-10 nm.

Referring to FIG. 1*d*, the FEOL device structure 10 is schematically illustrated in a cross-sectional view at a more advanced stage during fabrication, after a flowable chemical wafer deposition (FCVD) process is performed. As an option, the FCVD process may be combined with a high density plasma (HDP) process for filling the trench 110 by employing a plasma enhanced deposition process, such as PECVD or PEPVD. Accordingly, a first insulating filling material 117 may be deposited in the trench 110 so as to fill the trench 110, e.g., by an FCVD oxide.

Referring to FIG. 1*e*, the FEOL device structure 10 is schematically illustrated at a more advanced stage during fabrication, after a recessing is performed and the insulating filling material 117 (FIG. 1*d*) is etched back, resulting in an etched back insulating material 119 and a recess 118 present in the trench 110 (FIGS. 1*a*-1*c*). Accordingly, the recess 118 may partially expose the second insulating liner 115 within the trench 110. In other words, a lower portion of the second insulating liner 115 within the trench 110 close to a bottom portion of the trench 110 is covered by the insulating filling material 119, while an upper portion of the second insulating liner 115 at an upper portion of the trench 110 is exposed by the recess 118.

Referring to FIG. 1*f*, the FEOL device structure 10 is schematically illustrated in a cross-sectional view at a more advanced stage during fabrication, after an etching process is performed for pulling back the second insulating liner 115, i.e., by removing the exposed surfaces of the second insulating liner 115 within the recess 118 and outside the recess 118. Furthermore, due to the pull back of the second insulating liner 115, the first insulating liner 113 is removed outside the recess 118, while the first insulating liner 113 is only partially removed within the recess 118, resulting in remaining upper liner portions 123 of the first insulating liner 113 and by exposed surfaces 121 of the second insulating liner 115 which are substantially aligned with an upper exposed surface of the insulating filling material 119 and the trench 110.

Referring to FIG. 1f, the remaining upper portion 123 of the first insulating liner 113 may cover inner sidewalls of the trench 110 at the buried insulating material 103, particularly the recess 118 does not have any exposed surfaces of the buried insulating material 103. In other words, surfaces of the buried insulating material 103 are completely covered by the remaining upper liner portion 123 of the first insulating liner 113. In addition, as illustrated in FIG. 1f, the upper liner portion 123 of the first insulating liner 113 may at least partially cover the semiconductor layer 107 in the recess 118.

Referring to FIG. 1g, the FEOL device structure 10 is schematically illustrated in a cross-sectional view at a more advanced stage during fabrication, after an HDP material 125 is deposited within the recess 118 to fill the recess 118. For example, an HDP filling process may be performed, thereby overfilling the recess 118 with HDP material, and subsequently performing a chemical mechanical planarization to polish any exceeding HDP material down to the masking pattern 109. In accordance with some illustrative embodiments of the present disclosure, the HDP filling process may be a plasma enhanced CVD process, wherein an HDP oxide material is deposited within the recess 118. As an HDP oxide has a higher density when compared to the oxide deposited by FCVD, the trench isolation structure of the FEOL device structure 10 may be less prone to erosion in subsequent processing, i.e., subsequently performed etching and cleaning processes when continuing FEOL processing after formation of trench isolation structures is completed.

Referring to FIG. 1g, the FEOL device structure 10 comprises a trench isolation structure formed in the trench 110 (see FIG. 1a), wherein the trench isolation structure comprises the first and second insulating liners 113 and 115 formed on inner surfaces of the trench 110 (see FIG. 1c), wherein the first insulating liner is in direct contact with inner surfaces of the trench 110, and the second insulating liner 115 is formed directly on the first insulating liner 113, and insulating filling material 119 and the insulating filling material 125 both filling the trench 110 wherein the insulating filling material 125 is formed on the insulating filling material 119 and on the first and second insulating liners 113, 115 in the trench 110. As an HDP oxide has a higher density when compared to the oxide deposited by FCVD, the trench isolation structure of the FEOL device structure 10 may be less prone to erosion in subsequent processing, i.e., subsequently performed etching and cleaning processes when continuing FEOL processing after formation of trench isolation structures is completed.

Figure 2B:
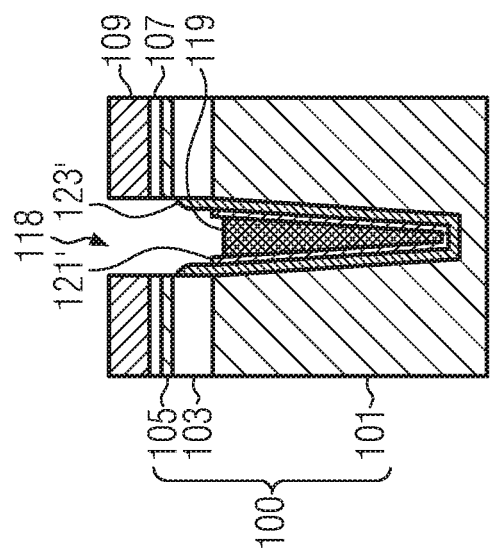

Referring to FIGS. 2a and 2b, alternative embodiments with respect to the previously described embodiments will be described.

FIG. 2a shows the FEOL device structure 10 at a stage during fabrication which corresponds to a stage performed after the processing as described above with regard to FIG. 1e is completed. In accordance with some illustrative examples herein, a pullback process is performed, for etching back the insulating material liner 115 in a manner similar as described above with regard to FIG. 1f, unless the pullback process is configured so as to partially expose the semiconductor layer 105 in the recess 118 by pulling back the insulating liner 113 within the trench 118 from the semiconductor layer 105. Accordingly, remaining upper liner portions 123' are formed in the trench 118, wherein the upper liner portion 123' only partially covers inner sidewalls of the buried insulating material 103 within the recess 118. Accordingly, more margin may be provided for a downstream filling process, employed for filling the recess 118.

FIG. 2b schematically illustrates the FEOL device structure 10 of FIG. 2a at a more advanced stage during fabrication, after a filling process is performed and the recess 118 is filled with an insulating filling material 125'.

The person skilled in the art will appreciate that, after having completed the trench isolation structure as discussed above with regard to FIGS. 2b and 1g, the processing may be continued by known further FEOL process steps employed when forming well regions and circuit device structures, such as transistors, capacitors and the like.

In summary, the present disclosure provides for a trench isolation structure having a dual liner structure comprising a first insulating liner and a second insulating liner, the first insulating liner having a thickness greater than a thickness of the second insulating liner, and a fill material formed within the trench, the fill material partially filling the trench. Furthermore, a second fill material is formed in the trench for completely filling the trench by the first and second filling materials. Herein, the first fill material may be a material deposited by FCVD processes, while the second fill material may be a high quality fill material, e.g., HDP oxide material. In this way, an upper liner portion of the first insulating liner may be formed after FCVD processes are completed and prior to filling a recess in the partially filled trench with an HDP material. The upper liner portion protects the semiconductor layer or buried insulating material of the semiconductor substrate which would otherwise become exposed during a pullback of the second insulating liner prior to the second filling process.

In accordance with some illustrative examples of the above described embodiments, trenches which are formed in accordance with the techniques presented above may have widths in a range from about 25 nm to about 25 µm and/or depths in a range from about 150 nm to about 350 nm relative to an upper surface of a substrate, e.g., the top of an SOI surface, in case of DTI isolation structures, whereas trenches of STI isolation structures (e.g., as indicated by a broken line in FIG. 1a) may have widths between about 25 nm and about 25 µm and/or depths in a range from about 15 nm to about 35 nm relative to an upper surface of a substrate, e.g., the top of an SOI surface.

The method(s) as described above is used in the fabrication of integrated circuit chips. The resulting integrated circuit chips can be distributed by the fabricator in raw wafer form (that is, as a single wafer that has multiple packaged chips), as a bare die, or in a packaged form. In the latter case, the chip is mounted in a single chip package (such as a plastic carrier, with leads that are affixed to a motherboard or another higher carrier), or in a multi-chip package (such as a ceramic carrier that has either or both surface interconnections or buried interconnections). In any case, the chip is then integrated with other chips, discrete circuit elements and/or other signal processing devices as part of either (a) an intermediate product, such as a motherboard, or (b) an end product. The end product can be any product that includes integrated circuit chips, ranging from toys and other low end applications to advanced computer products having a display, a keyboard or other input devices and a central processor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A device, comprising:
   a semiconductor substrate having a first trench formed therein; and
   a first trench isolation structure formed in said first trench, wherein said first trench isolation structure comprises:
      first and second insulating liners formed adjacent inner surfaces of said first trench, wherein said first insulating liner is in direct contact with inner surfaces of said first trench and said second insulating liner is formed directly on said first insulating liner;
      a first insulating filling material at least partially filling said first trench; and
      a second insulating filling material formed on said first and second insulating liners and on said first insulating filling material in said first trench and directly contacting an upper surface portion of said first insulating liner.

2. The device of claim 1, wherein said thickness of said first insulating liner is at least 1.5 times greater than said thickness of said second insulating liner.

3. The device of claim 1, wherein said thickness of said first insulating liner is in a range from 2-15 nm and said thickness of said second insulating liner is in a range from 2-10 nm.

4. The device of claim 1, wherein:
   said semiconductor substrate has a semiconductor-on-insulator (SOI) configuration, comprising a semiconductor layer, a semiconductor base substrate and a buried insulating material layer interposed between said semiconductor layer and said semiconductor base substrate; and
   said first trench of said first trench isolation structure at least partially extends into said semiconductor base substrate.

5. The device of claim 4, wherein an upper portion of said first insulating liner at least partially covers an inner surface of said semiconductor layer in said first trench.

6. The device of claim 4, further comprising a second trench which at most partially extends into said buried insulating material layer, wherein said second trench is completely filled by a second insulating filling material.

7. The device of claim 4, wherein said upper surface portion of said first insulating liner directly contacted by said second insulating filling material is positioned adjacent said buried insulating material layer.

8. The device of claim 1, wherein said first insulating filling material is an oxide material formed by a flowable chemical vapor deposition (FCVD) process and said second insulating filling material is a high density plasma (HDP) oxide.

9. A device, comprising:
   a semiconductor substrate having a semiconductor-on-insulator (SOI) configuration, comprising a semiconductor layer, a semiconductor base substrate and a buried insulating material layer interposed between said semiconductor layer and said semiconductor base substrate, and said semiconductor substrate having a trench formed therein, said trench at least partially extending into said semiconductor base substrate; and
   a trench isolation structure formed in said trench, wherein said trench isolation structure comprises:
      first and second insulating liners formed adjacent inner surfaces of said trench, wherein said first insulating liner is in direct contact with said inner surfaces of said trench and said second insulating liner is formed directly on said first insulating liner; and
      first and second insulating filling materials filling said trench, wherein said second insulating filling material is formed on said first and second insulating liners and said first insulating filling material in said trench and said second insulating filling material directly contacts an upper surface portion of said first insulating liner adjacent said buried insulating layer.

10. The device of claim 9, wherein said first insulating filling material is an oxide material formed by a flowable chemical vapor deposition (FCVD) process and said second insulating filling material is a high density plasma (HDP) oxide.

11. The device of claim 9, wherein an upper portion of said first insulating liner at least partially covers an inner surface of said semiconductor layer in said trench.

12. The device of claim 9, wherein said second insulating filling material directly contacts an inner surface of said semiconductor layer in said trench.

13. The device of claim 9, wherein a thickness of said first insulating liner is greater than a thickness of said second insulating liner.

14. A method, comprising:
   etching a first trench into a semiconductor substrate;
   consecutively forming first and second insulating liners in said first trench;
   forming a first insulating filling material on said first and second insulating liners in said first trench;
   performing a recessing process after said first insulating filling material is formed, wherein an upper portion of said first insulating filling material is removed and an upper portion of said second insulating liner is exposed;
   performing a pullback etching process, wherein said exposed upper portion of said second insulating liner material is removed and an upper surface portion of said first insulating liner is exposed; and
   filling said first trench with a second insulating filling material, wherein said exposed upper surface portion of said first insulating liner is directly contacted by said second insulating filing material.

15. The method of claim 14, wherein forming said first insulating filling material comprises filling said first trench with a flowable oxide chemical vapor deposition (FCVD) process and subsequently performing a densification annealing process.

16. The method of claim 14, wherein filling said first trench with said second insulating filling material comprises performing a high density plasma (HDP) deposition process.

17. The method of claim 14, wherein:
said semiconductor substrate has a semiconductor-on-insulator (SOI) configuration, comprising a semiconductor layer, a semiconductor base substrate and a buried insulating material layer interposed between said semiconductor layer and said semiconductor base substrate;
said first trench of said first trench isolation structure at least partially extends into said semiconductor base substrate; and
said exposed upper portion of said first insulating liner at least partially covers an inner surface of said semiconductor layer in said first trench.

18. The method of claim 14, wherein:
said semiconductor substrate has a semiconductor-on-insulator (SOI) configuration, comprising a semiconductor layer, a semiconductor base substrate and a buried insulating material layer interposed between said semiconductor layer and said semiconductor base substrate;
said first trench of said first trench isolation structure at least partially extends into said semiconductor base substrate; and
said exposed upper portion of said first insulating liner leaves an inner surface of said semiconductor layer exposed in said first trench.

19. The method of claim 18, wherein
said upper surface portion of said first insulating liner is positioned adjacent said buried insulating material layer.

* * * * *